United States Patent [19]
Soobitsky

[11] Patent Number: 4,577,131
[45] Date of Patent: Mar. 18, 1986

[54] PIEZOELECTRIC MICROMOTION ACTUATOR

[75] Inventor: James A. Soobitsky, Higganum, Conn.

[73] Assignee: Zygo Corporation, Middlefield, Conn.

[21] Appl. No.: 566,686

[22] Filed: Dec. 29, 1983

[51] Int. Cl.$^4$ .............................................. H01L 41/08
[52] U.S. Cl. .................................... 310/328; 350/487; 356/345
[58] Field of Search ................. 310/328; 356/106 LR; 350/210, 289, 295, 487

[56] References Cited
U.S. PATENT DOCUMENTS

| | | | |
|---|---|---|---|
| 3,360,665 | 12/1967 | Boswell | 310/328 |
| 4,011,474 | 3/1977 | O'Neill | 310/328 |
| 4,160,184 | 7/1979 | Ljung | 310/328 |
| 4,342,935 | 8/1982 | Kallmeyer et al. | 310/328 |
| 4,382,243 | 5/1983 | Babitzka et al. | 310/328 X |
| 4,408,832 | 10/1983 | Hartman et al. | 310/328 X |

Primary Examiner—Mark O. Budd
Attorney, Agent, or Firm—Stiefel, Gross, Kurland & Pavane

[57] ABSTRACT

Apparatus is disclosed for supporting an optical element which can move the element in an extremely precise, tilt-free translation in a straight line over a distance of one-half a wavelength of visible light. The invention comprises in one embodiment a piezoelectric transducer mechanically coupled to a flexure tube using hardened conical points.

12 Claims, 4 Drawing Figures

TOP VIEW

SIDE VIEW

PIEZOELECTRIC MICROMOTION ACTUATOR

BACKGROUND OF THE INVENTION

1. Field of the Invention

The present invention relates to apparatus which provides precise linear motion. More particularly, the invention relates to apparatus for use in conjunction with either plano or spherical interferometers for the purpose of rapidly and accurately measuring the distortion of either surfaces or transmitted wavefronts.

2. The Prior Art

The use of interferometry to measure optical components and systems has grown significantly due to technological advances in lasers, photosensors, and microcomputers. At the same time, relatively low-cost instruments have become more widely available for automatic data analysis and quantitative evaluation of interference patterns; see, for example, C. Zanoni, "Interferometry," *The Optical Industry and Systems Purchasing Directory*, Book 2, pp. E-80-E-82 (1983).

Phase measuring interferometry (PMI) provides the optical path difference between the two wavefronts of the interferometer at each resolution element of the detector while phase modulating the interference pattern; see, for example, J. H. Burning, et al., "Digital Wavefront Measuring Interferometer for Testing Optical Surfaces and Lenses," *Applied Optics*, vol. 13, pp. 2693-2703 (1974); Gallagher, et al., U.S. Pat. No. 3,694,088 issued Sept. 26, 1972; N. Balasubramanian, U.S. Pat. No. 4,225,240 issued Sept. 30, 1980; M. Schaham, *Proceedings SPIE*, vol. 306, pp. 183-191 (1981); and H. Z. Hu, "Polarization heterodyne interferometry using a simple rotating analyzer. 1: Theory and error analysis," *Applied Optics*, vol. 22, pp. 2052-2056 (1983).

Phase measuring interferometry is capable of providing high data density and is insensitive not only to the intensity profile of the beam but also to the geometrical distortion in the optics or detector to first order. This makes phase measuring interferometry potentially more accurate than fringe pattern interferometry. It also enables the measurement of wavefronts of any fringe geometry and complexity as long as the maximum fringe density does not exceed one fringe/two resolution elements (pixels) of the detector.

In prior-art measuring techniques, the optical path difference, or phase, between the two wavefronts of the interferometer is altered, or modulated, by a known amount by one of the following means: (1) mechanically moving an optical element of the interferometer with a piezoelectric transducer, (2) rotating a phase retardation plate in the interferometer, (3) use of either an acousto-optic, electro-optic, or similar device in the interferometer, and (4) variation of the incident angle, see for example, Moore, U.S. Pat. No. 4,325,637 issued Apr. 20, 1982. Most of the prior-art phase modulators require the use of refractive optics in the measurement leg of the interferometer for either large aperture or fast spherical measurements. The refractive optics are not only a serious source of error but also quite expensive. Similarly, the use of phase retardation elements for large apertures and fast spherical measurements presents the same problems.

Prior-art phase modulators of the mechanical type have been used only with small aperture diameter, i.e., 2-10 cm, plano optical elements because of their limited load carrying capacity and because of the errors introduced in fast spherical measurements due to the imprecise motion. A phase modulator of the mechanical type must be capable of moving an optical element in an extremely precise, tilt-free translation in a straight line over a distance of one-half the wavelength of the radiant energy of the interferometer. A practical phase modulator of the mechanical type must also be capable of supporting a variety of reference surfaces and operating at any orientation relative to the vertical so that it can be used for many applications. Furthermore, when an optical element with a non-plano surface must be moved to achieve the phase modulation, elaborate corrections must be made in the data analysis, see for example, R. C. Moore, "Direct measurement of phase in a sphericalwave Fizeau interferometer," *Applied Optics*, vol. 19, pp. 2196-2200 (1980). Variation of the incident angle is useful for low precision, plano measurements. Specifically, all of the prior-art modulation techniques are expensive and introduce significant measurement errors when large aperture or fast spherical wavefront measurements are required.

In a copending application, Ser. No. 515,393, filed July 20, 1983 "Interferometric Wavefront Measurement", assigned to the assignee of this application, an improved phase modulation apparatus and method is disclosed; however, it can be used only at wavelengths for which diode lasers with sufficient power and coherence length are available, and it cannot be used in an equal path interferometer.

While prior-art modulation techniques are useful for some applications, it is desirable to do phase measuring interferometry with a modulation technique which is not subject to the limitations inherent in the prior-art modulation techniques.

OBJECT OF THE INVENTION

In view of the foregoing, it is the main object of this invention to provide an improved modulator for phase measuring interferometry which greatly reduces the inherent errors in large aperture and fast spherical measurements.

Another object of the invention is to provide such a phase modulator which has significant load carrying capacity.

Another object of the invention is to provide such a phase modulator which can be used in any orientation relative to the vertical.

Another object of the invention is to provide such a phase modulator which readily accommodates radiant energy of any wavelength.

Another object of the invention is to provide such a phase modulator which obviates the need for refractive optics in the interferometer cavity.

Another object of the invention is to provide such a phase modulator which can be used with either an equal or an unequal path interferometer.

STATEMENT OF THE INVENTION

In accordance with the instant invention, I provide a micromotion actuator capable of transmitting, in a substantially tilt-free linear fashion, a translation induced electrically comprising (a) a transducer which expands and contracts in response to variations in an electric signal (e.g. piezoelectric transducer) (b) a cylindrical flexure tube in which said transducer is mounted, means (c) for connecting said transducer to said flexure tube in such fashion that the transducer motion acts substantially completely along the axis of said flexure tube and (d) means for mounting an element to be moved on said flexure tube. The means for connecting or coupling the transducer to the flexure tube most preferably comprises pairs of hardened male and female cones, one of each pair being attached to said transducer and the other of each pair being attached to said cylindrical flexure tube so that the points of the two cones attached to said flexure tube lie on the axis of said cylindrical flexure tube. The cones are most preferably attached to the flexure tube by clamping friction.

The invention also comprises a phase measuring interferometer in which an element of the interferometer is mounted on at least one cylindrical flexure tube above described so that the length of the interferometer cavity can be varied in a precise fashion by the electrical signal controlling the transducer.

THE DRAWINGS

Figure 3B:
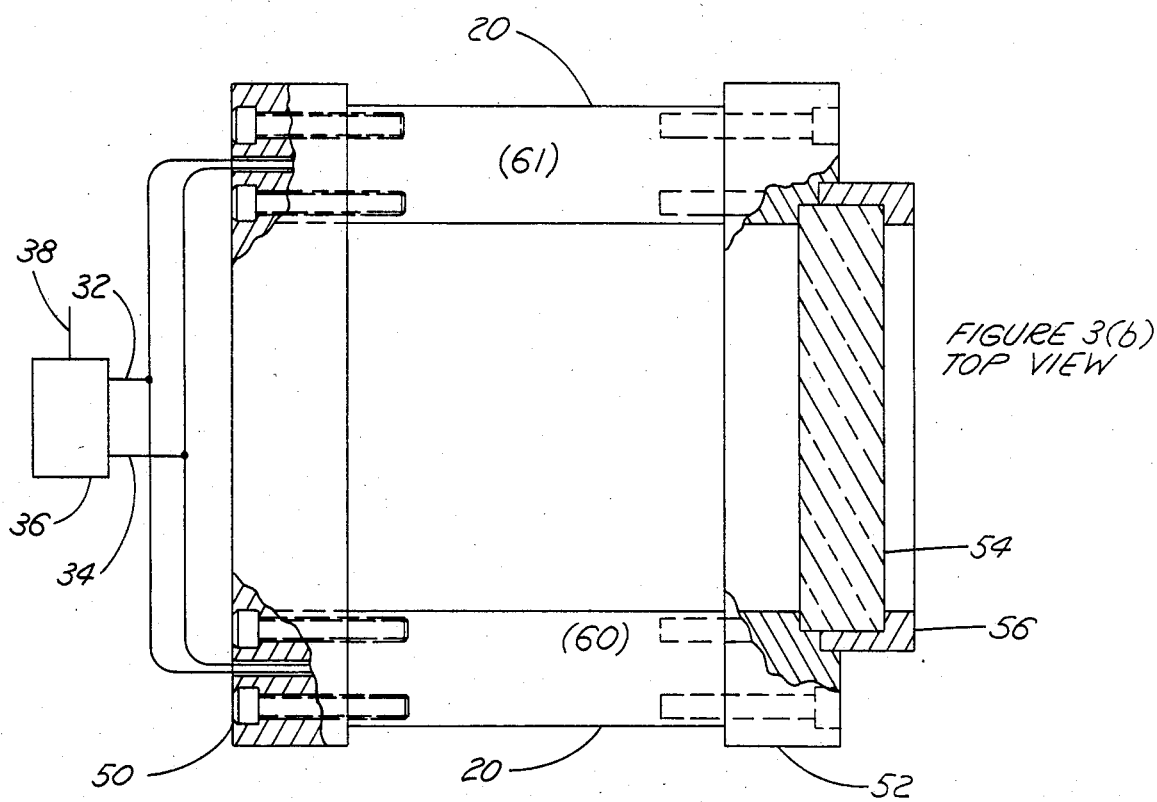
Figure 3A:
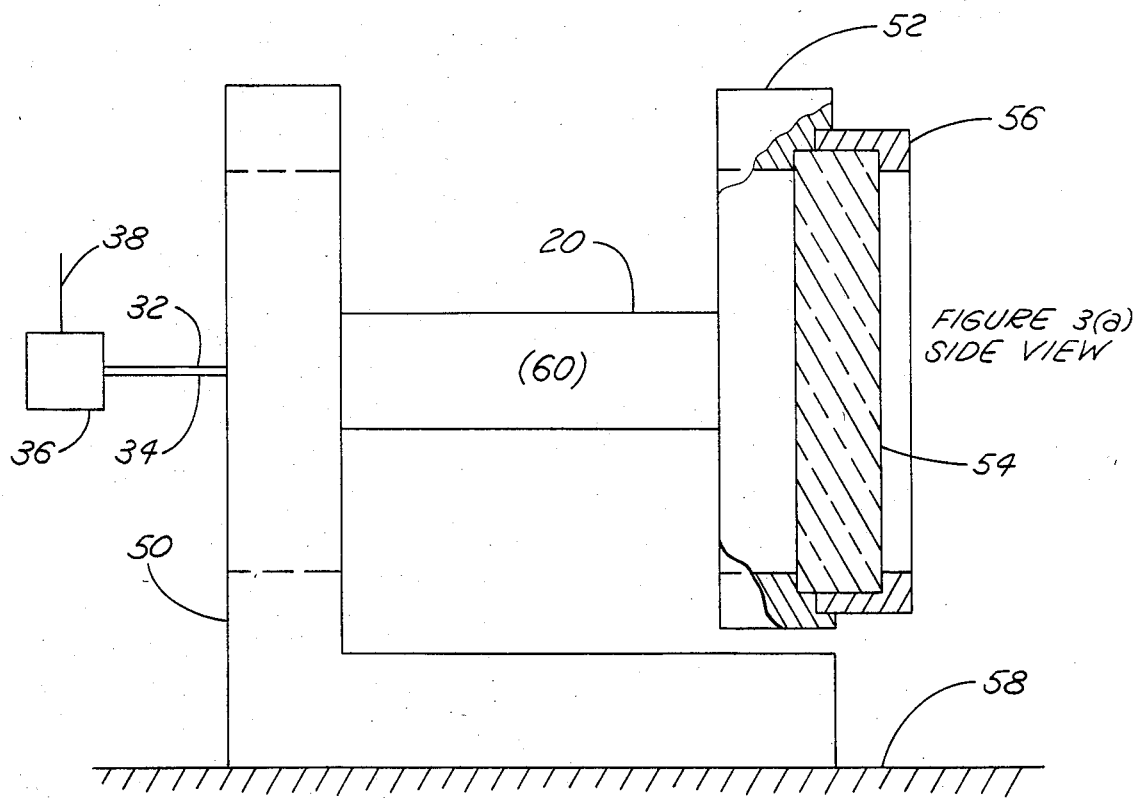

FIGS. 3(a) and 3(b) depict in schematic form a 4-inch aperture phase modulator using the instant invention, with FIG. 3(a) being a side view thereof and FIG. 3(b) being a top view thereof.

DETAILED DESCRIPTION OF THE INVENTION

Figure 1:
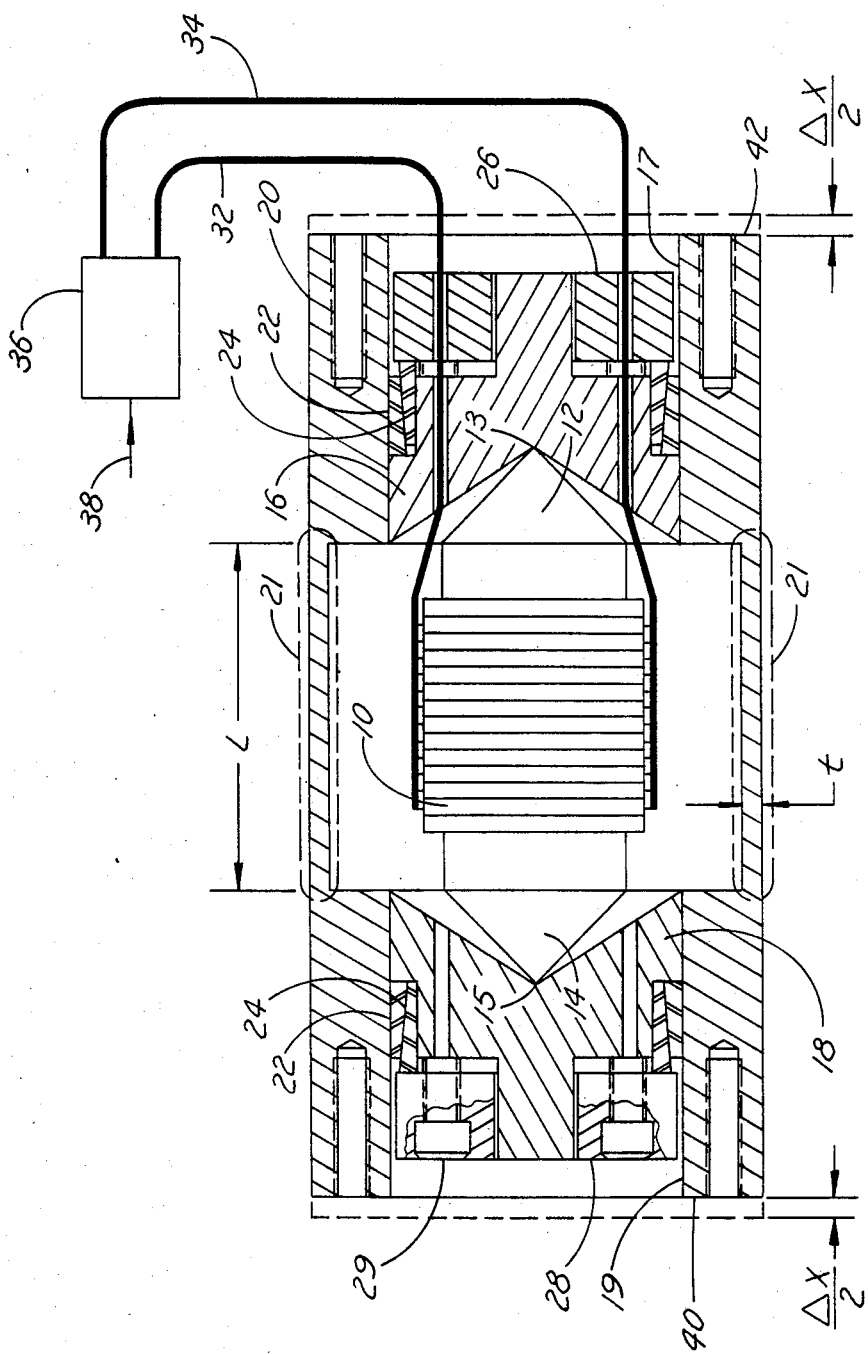
FIG. 1 depicts in schematic form a cross section of an embodiment of the instant invention.

FIG. 1 depicts in schematic form a cross section of an embodiment of the instant invention. The flexure tube (20) is a cylinder with a cross sectional form as shown in FIG. 1. The central region (21), within the dashes, of flexure tube (20) has a wall thickness, t, and length, L, which are calculated to provide the translation $\Delta x$ required based on the modulus of elasticity of the material of the flexure tube (20). An aluminum alloy is a suitable material for the flexure tube (20) because of its lower modulus of elasticity and high strength. A time dependent electrical signal (38) which conforms to the modulation waveform desired is applied to the high voltage amplifier (36). The output (32) and (34) of amplifier (36) is applied to the piezoelectric transducer (10) which may be a stack of piezoelectric disks, a piezoelectric tube, or segments of piezoelectric tubes. The hardened conical points (12) and (14) are bonded to the ends of the piezoelectric transducer (10). The hardened conical points (12) and (14) fit into hardened contact points (13) and (15), respectively. The hardened contact points (13) and (15) are precisely centered relative to the outer diameter of elements (16) and (18), respectively. The inner diameters (17) and (19) of flexure tube (20) are made precisely concentric. Elements (16) and (18) are fixed to the flexure tube (20) with the tapered rings (22) and (24), there are two pairs, which are axially squeezed by the screws (29), typically on both sides, and the clamping plates (26) and (28). The clamping friction connection so produced permits not only accurate centering of the conical points, but also provides uniform circumferential loading which cannot be obtained to the level required with a threaded connection. During assembly, a preload is applied to the piezoelectric transducer (10) before the assembly is locked in place.

Elements (12), (14), (16), and (18) are made of A2 medium alloy tool steel because of its high yield strength and dimensional stability during hardening.

When a voltage is applied to the piezoelectric transducer (10), it expands and applies a purely axial force to the flexure tube (20) which causes the tube to lengthen by an amount $\Delta x$. The flexure tube (20) acts as a cylindrical spring which can be stretched by the piezoelectric transducer (10) and which can support various loads at any orientation relative to the vertical. The elements (16) and (18) are precisely fit into the inner diameter of flexure tube (20), and the contact points (13) and (15) are accurately centered with respect to the inner diameter of the flexure tube (20). This is done to insure the applied force from the piezoelectric transducer (10) acts along the centerline of the flexure tube (20). The point contacts do not allow non-parallel end motion of the piezoelectric transducer (10) to be transmitted to the flexure tube (20) in the form of a moment. The double cone points also ease the assembly of the micromotion actuator.

Figure 2:
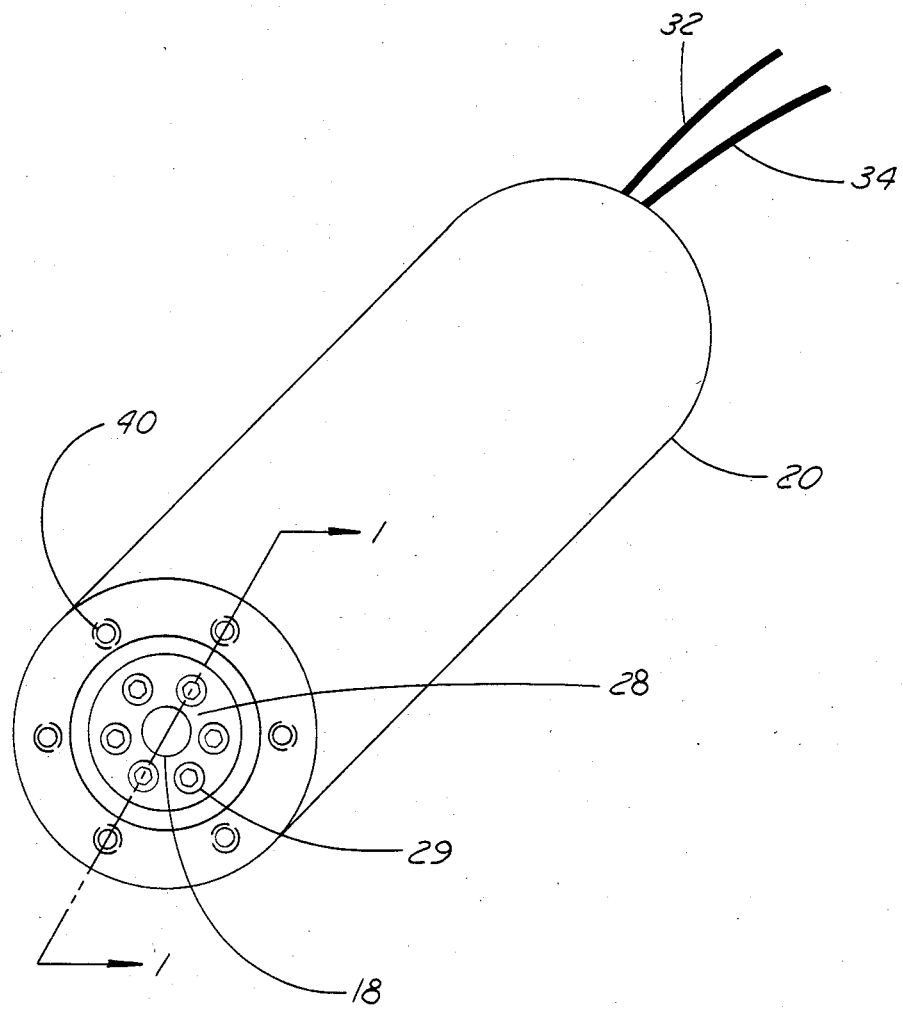
FIG. 2 depicts in schematic form the external features of the instant invention.

FIG. 2 depicts in schematic form the external features of the instant invention. Tapped holes (40), typically on both ends, are used to mount the micromotion actuator to a static support at one end and the holder element for the optical element which must be translated as shown in FIG. 3.

Phase modulators made from micromotion actuators of the instant invention have been verified to provide linear axial motion of one-half the wavelength of the radiant energy of the interferometer, e.g., 0.31 micrometer, with transverse motion of less than one-fiftieth of a wavelength, e.g., 0.01 micrometer.

FIGS. 3(a) and 3(b) depict in schematic form a 4-inch aperture phase modulator using the instant invention, with FIG. 3(a) being a side view and FIG. 3(b) being a top view thereof.

In FIG. 3(a), the static support base (50) rests on a rigid surface (58) upon which an interferometer (not shown) is assembled and used. If the support base (50) is mounted to the interferometer itself, then the rigid surface (58) may not be needed. The interferometer element (54) is mounted in the structure (52) with retainer (56). The assembly of (52), (54), and (56) is attached to static support (50) by a pair of micromotion actuators (60) and (61) which are enclosed in the flexure tubes (20). A time dependent electrical signal (38) which conforms to the modulation waveform desired is applied to the high voltage amplifier (36). The output (32) and (34) of amplifier (36) is fed to each micromotion actuator, (60) and (61).

While a preferred embodiment of the invention has been disclosed, obviously modification can be made therein, without departing from the scope of the invention as defined in the following claims.

What is claimed:

1. A micromotion actuator for transmitting in a substantially tilt free linear fashion a translation induced electrically comprising (a) a piezoelectric type transducer which expands and contracts in response to variations in an electric signal, (b) a cylindrical flexure tube in which said transducer is mounted, (c) means for coupling said transducer to said flexure tube for linearly translating at least one end of said flexure tube in a tilt-free translation on the order of at least a fraction of a wavelength of light essentially solely in a direction parallel to the longitudinal axis of said flexure tube when said transducer expands or contracts in response to variations in said electric signal while decoupling tilted or sideways motion of said transducer, and (d) means for coupling an element to be moved to at least said flexure tube one end for enabling linear displacement of said element on the order of at least a fraction of a wavelength of light in response to said tilt-free translation of said flexure tube one end; whereby accurate linear displacement of said element may be provided in response to said variations in said electric signal.

2. The actuator in claim 1 wherein said coupling means comprises means for preventing any non-parallel end motion for said transducer to be transmitted to said flexure tube in the form of a moment.

3. The actuator in claim 2 wherein said non-parallel end motion preventing means comprises pairs of hardened male and female cones, one of each pair being attached to said transducer and the other of each pair being attached to said cylindrical flexure tube so that the points of the two cones attached to said flexure tube lie on the axis of said cylindrical flexure tube.

4. The actuator in claim 2 wherein said non-parallel end motion preventing means comprises pairs of hardened male and female cones, one of each pair being attached to said transducer and the other of each pair being attached to said cylindrical flexure tube and by clamping friction means, so that the points of the two cones attached to said cylindrical flexure tube lie on the axis of said cylindrical flexure tube.

5. A micromotion actuator for transmitting in a substantially tilt-free linear fashion a translation induced electrically comprising (a) a transducer which expands and contracts in response to variations in an electric signal, (b) a cylindrical flexure tube in which said transducer is mounted, (c) means for coupling said transducer to said flexure tube such that the transducer motion acts on the flexure tube substantially completely in a direction parallel to the axis of said tube, said coupling means comprising pairs of hardened male and female cones, one of each pair being attached to said transducer and the other of each pair being attached to said cylindrical flexure tube so that the points of the two cones attached to said flexure tube lie on the axis of said cylindrical flexure tube and (d) means for mounting an element to be moved on said flexure tube.

6. A micromotion actuator for transmitting in a substantially tilt-free linear fashion a translation induced electrically comprising (a) a transducer which expands and contracts in response to variations in an electric signal, (b) a cylindrical flexure tube in which said transducer is mounted, (c) means for coupling said transducer to said flexure tube such that the transducer motion acts on the flexure tube substantially completely in a direction parallel to the axis of said tube, said coupling means comprising pairs of hardened male and female cones, one of each pair being attached to said transducer and the other of each pair being attached to said cylindrical flexure tube and by clamping friction means, so that the points of the two cones attached to said cylindrical flexure tube lie on the axis of said cylindrical flexure tube and (d) means for mounting an element to be moved on said flexure tube.

7. In a phase measuring interferometer having an interferometer cavity in which one element is translated relative to another element along their common optical axis for providing shifts in an interference pattern; the improvement comprising a micromotion actuator for enabling linear tilt-free translation of said one element, said actuator comprising (a) a piezoelectric type transducer which expands and contracts in response to variations in an electric signal, (b) a cylindrical flexure tube in which said transducer is mounted, (c) means for coupling said transducer to said flexure tube for linearly translating at least one end of said flexure tube on the order of at least a fraction of a wavelength of light essentially solely in a direction parallel to the longitudinal axis of said flexure tube when said transducer expands or contracts in response to variations in said electric signal while decoupling tilted or sideways motion of said transducer, and (d) means for coupling said one element to at least said flexure tube one end for enabling linear displacement of said element on the order of at least a fraction of a wavelength of light in response to said tilt-free translation of said flexure tube one end; whereby accurate linear displacement of said element may be provided in response to said variations in said electric signal.

8. The interferometer in claim 7 wherein said coupling means comprises means for preventing any non-parallel end motion for said transducer to be transmitted to said flexure tube in the form of a moment.

9. The interferometer in claim 8 wherein said non-parallel end motion preventing means comprises pairs of hardened male and female cones, one of each pair being attached to said transducer and the other of each pair being attached to said cylindrical flexure tube so that the points of the two cones attached to said flexure tube lie on the axis of said cylindrical flexure tube.

10. The interferometer in claim 8 wherein said non-parallel end motion preventing means comprises pairs of hardened male and female cones, one of each pair being attached to said transducer and the other of each pair being attached to said cylindrical flexure tube and by clamping friction means, so that the points of the two cones attached to said cylindrical flexure tube lie on the axis of said cylindrical flexure tube.

11. The interferometer in claim 7 wherein said coupling means comprises pairs of hardened male and female cones, one of each pair being attached to said transducer and the other of each pair being attached to said cylindrical flexure tube so that the points of the two cones attached to said flexure tube lie on the axis of said cylindrical flexure tube.

12. The interferometer in claim 7 wherein said coupling means comprises pairs of hardened male and female cones, one of each pair being attached to said transducer and the other of each pair being attached to said cylindrical flexure tube and by clamping friction means, so that the points or the two cones attached to said cylindrical flexure tube lie on the axis of said cylindrical flexure tube.

* * * * *